United States Patent
Daniel et al.

(10) Patent No.: US 8,976,093 B2
(45) Date of Patent: Mar. 10, 2015

(54) PRINTED INTERACTIVE CARD WITH PIEZO-POWERED INDICATOR

(75) Inventors: Jurgen H. Daniel, San Francisco, CA (US); Tse Nga Ng, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 925 days.

(21) Appl. No.: 12/970,092

(22) Filed: Dec. 16, 2010

(65) Prior Publication Data

US 2012/0154349 A1   Jun. 21, 2012

(51) Int. Cl.
G09G 3/36   (2006.01)
G09G 3/16   (2006.01)
H01L 41/113   (2006.01)
H02N 2/18   (2006.01)
G09G 3/34   (2006.01)

(52) U.S. Cl.
CPC ............. *G09G 3/16* (2013.01); *H01L 41/1136* (2013.01); *H02N 2/18* (2013.01); *H02N 2/181* (2013.01); *H02N 2/186* (2013.01); *G09G 3/344* (2013.01); *G09G 2330/02* (2013.01); *G09G 2380/02* (2013.01)
USPC .............. 345/87; 345/204; 345/211; 310/330

(58) Field of Classification Search
USPC ............ 345/87, 204, 211–213, 690; 310/330, 310/338, 339; 347/110
See application file for complete search history.

(56) References Cited

U.S. PATENT DOCUMENTS

| | | | |
|---|---|---|---|
| 4,940,681 A | 7/1990 | Ushida et al. | |
| 5,566,982 A * | 10/1996 | Lehureau et al. | 283/83 |
| 6,118,426 A | 9/2000 | Albert et al. | |
| 6,130,773 A * | 10/2000 | Jacobson et al. | 359/296 |
| 6,185,801 B1 | 2/2001 | Kadota et al. | |
| 6,879,809 B1 | 4/2005 | Vega et al. | |
| 7,372,191 B2 * | 5/2008 | Ohmori et al. | 310/330 |
| 2010/0245112 A1 * | 9/2010 | Ludwig et al. | 340/825.36 |
| 2010/0277441 A1 * | 11/2010 | Stahl et al. | 345/204 |
| 2012/0154349 A1 | 6/2012 | Daniel et al. | |

FOREIGN PATENT DOCUMENTS

JP   08187983   7/1996

OTHER PUBLICATIONS www.vdma.org/wps/portal/Home/en/Branchen/O/OEA/?WCM_GLOBAL_CONTEXT=/vdma/Home/en/Branchen/O/OEA/, Feb. 2009.
www.novaled.com/downloadcenter/OE-A_Brochure2009_lowres.pdf, Aug. 2009.
U.S. Appl. No. 12/970,116.

* cited by examiner

*Primary Examiner* — Jennifer Nguyen
(74) *Attorney, Agent, or Firm* — Hollingsworth Davis, LLC

(57) ABSTRACT

An interactive card or the like employs a piezoelectric charge generator (piezo-strip) for temporarily driving an indicator. The piezo-strip may be displaced (bent) in order to generate charge to drive the indicator. Printed electronic processes are utilized to produce the indicator and/or the piezoelectric charge generator The need for a printed battery or supplemental power source is obviated. The card may carry printed indicia which corresponds to the states of the indicator (e.g., indication of a test answer selection). Multiple display elements and selector switches may provide multiple indicator states. Multiple piezo-strips may provide a selection function as well as a rest function. Applications include business cards, greeting cards and novelty items, toys and games, advertising and promotions, testing and education, sensors, and so forth.

18 Claims, 5 Drawing Sheets

PRINTED INTERACTIVE CARD WITH PIEZO-POWERED INDICATOR

BACKGROUND

The present disclosure is related to display devices, and more specifically to a card or the like employing a piezoelectric charge generator for temporarily driving a display.

There are today a relatively large number of different techniques for producing electronic devices. One family of such techniques, of interest herein, is commonly referred to as printed electronics processes, and the resulting devices referred to as printed electronics. Various methods fall within the definition of printed electronics processes. Screen printing, traditional and digital lithography, flexography, gravure and jet-printing are a number of the more common of such methods. In each case, a conductive, semi-conductive or insulating material is deposited over a substrate to form interconnected passive and/or active electronic components. Printing processes typically deposit materials in the form of a solution, a slurry or a powder. Transfer processes such as thermal transfer or laser transfer processes may also be used to print structures. In a thermal transfer process, a layer such as a metal film may be transferred from a carrier substrate to another substrate. Known printed electronic processes can utilize a wide variety of materials for these components, and are not limited to organic materials.

Printed electronics processes enable the integration of electronic, optical, and other functionalities into products at potentially ultra-low cost. Printed electronic processes take advantage of known, relatively simple printing techniques, and are thus typically less expensive and often less environmentally hazardous than traditional lithography and deposition techniques. Certain materials and techniques used for printed electronics processes permit printing on non-crystalline substrates, such as paper, plastic, fabric, etc. Such processes may permit printing on flexible substrates, which is not easily done with conventional electronic device fabrication techniques. Furthermore, printing processes have been developed for non-planar surfaces, which is also a challenge for conventional electronic device fabrication techniques. However, in order to maintain low cost and/or substrate flexibility, the components produced by printed electronic processes are relatively large, the circuits are relatively simple, and the circuits are fixed in terms of circuit layout and characteristics once produced.

"Printed" batteries are often provided in order to provide power to associated printed electronic circuits. However, printed batteries have several disadvantages. Batteries employ electrolytes that make fabrication (particular with respect to sealing or encapsulation) relatively complex. Moreover, batteries lose charge over time. Batteries of sufficient charge often have a relatively large form factor, incompatible with ultra-compact or ultra-thin devices. Printed batteries may also significantly add to the cost of producing a printed electronics device.

Accordingly, there is a need for a printed electronics device with an improved power source. The power source preferably is relatively simply in design, relatively inexpensive to manufacture, may be manufactured by methods compatible with otherwise known printed electronic devices, does not suffer from loss of charge over time, and may be relatively very compact and/or thin.

SUMMARY

Accordingly, the present disclosure is directed to systems and methods for providing a card or the like employing a piezoelectric charge generator for temporarily driving a display. Printed electronic processes are utilized, and the need for a printed or supplemental battery is obviated.

According to a first aspect of the disclosure the card comprises an interactive electronic card such as business card, playing card, etc. The card may be used to exchange information (such as an address in the case of a business card) or it may be used for entertainment or advertisement purposed, etc.

A piezo-strip may be printed onto the card and an indicator may be connected thereto. The piezo-strip may also be laminated or otherwise attached to the substrate. In either case, the piezo-strip may be formed by printed electronics processes. The piezo-strip may be deflected (i.e., bent). When deflected, the piezo-strip generates a charge which may temporally drive the indicator in order to provide an interactive effect.

According to one aspect of the disclosure, the indicator is a display device, which when driven by the piezo-strip provides a printed message, image, etc. According to alternative aspects, the indicator provides audible, thermal, haptic (tactile), radio-communicative, etc. feedback. The indicator may also be formed by printed electronics processes.

The interactive indicative aspect of the card provided by the present disclosure adds value to the card since the user likely will spend more time looking at the card, may keep the card as opposed to simply throwing it away, may share the card with friends or colleagues, etc.

Thus, disclosed is an interactive card with indicator, comprising a substrate, a printed electronics indicator formed on said substrate, a first printed electronics displaceable region of piezoelectric material associated with said substrate, electrical interconnections on said substrate connecting said indicator and said first region of piezoelectric material such that displacement of said first region of piezoelectric material generates a voltage therein that is provided to said indicator in order to actuate said indicator and thereby indicate the displacement of said first region of piezoelectric material. A method of forming the interactive card with indicator is also disclosed.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known starting materials, processing techniques, components, equipment and other well-known details are merely summarized or are omitted so as not to unnecessarily obscure the details of the present invention. Thus, where details are otherwise well known, we leave it to the application of the present invention to suggest or dictate choices relating to those details.

Figure 1:
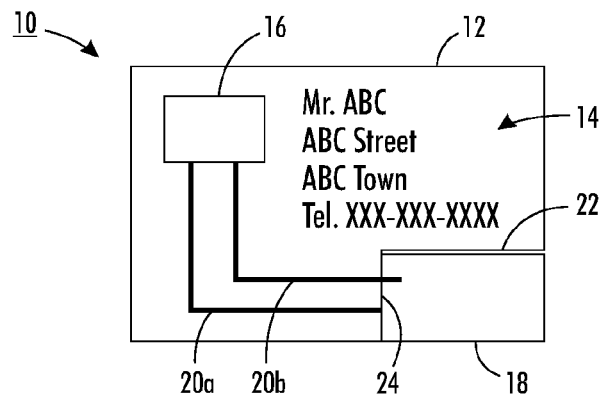
FIG. 1 is an illustration of a display-capable business card with piezo-strip according to an embodiment of the present disclosure.

The piezo-charge concepts of the present disclosure are applicable to a wide variety of applications. However, in order to illustrate certain general concepts of the disclosure, a basic first embodiment comprising a display-capable business card is selected and discussed. It will be appreciated that the scope of the present disclosure is, of course, not limited to such an application. FIG. 1 illustrates such a display-capable business card 10 according to a first embodiment. Card 10 comprises a substrate 12, which in some embodiments may be paper, card-stock, plastic, fiber-composite, laminate, or other appropriate material that may function as a business card (or alternatively as a playing card, game card, toy, sensor strip, flier, promotional advertisement, etc.) Substrate 12 may in certain embodiments have printed indicia 14 formed thereon. An indicator 16, a piezo-strip 18, and electrical interconnections 20a, 20b connecting indicator 16 and piezo-strip 18 are formed preferably by printed electronics processes on substrate 12.

Optional printed indicia 14 may be purely informative, such as a name, address, photograph and so forth on a business card. Or, printed indicia 14 may be tied to the output of indicator 16. For example, the printed indicia may be a question posed as part of a board game, classroom teaching lesson, etc. The correct answer may be revealed by displacement of piezo-strip 18, causing the answer to show in indicator 16.

Indicator 16 may be a visual indicator such as an emissive or reflective display. It may be bistable or grayscale, In other embodiments, the output of indicator 16 may be audible, thermal, haptic (tactile), radio-communicative, etc. In one embodiment, indicator 16 is an electrophoretic display. Such displays contain small, mobile particles that migrate or change orientation in the presence of an electric field. The amount of particle movement, and hence the visible contrast or change in color or tone, vary as a function of the duration and magnitude of the electric field. Such materials are compatible with printed electronic processes, thus the printed electronic processes used to form other elements on substrate 12 may also be used to form indicator 16. While an electrophoretic display element is described above, other display types may similarly be employed. For example, liquid crystal, electrochromic, electrowetting, light emitting (e.g., organic LED), interference, electrochemical, and other forms of displays may be used. In these cases, the output of piezo-strip 18 may operate switching circuits, such as thin film transistors (not shown) to regulate the application of an appropriate driving current.

Figure 2:
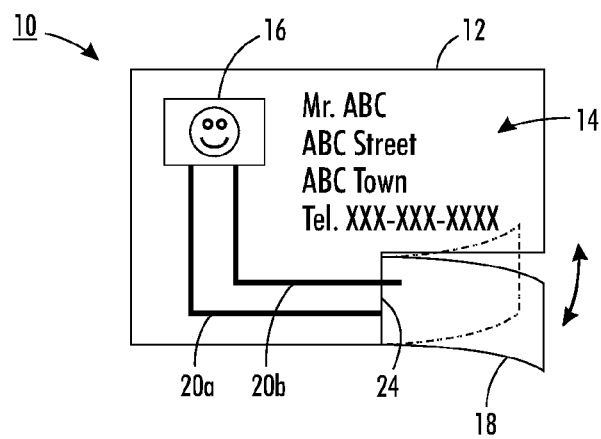
FIG. 2 is an illustration of the display-capable business card with piezo-strip according to FIG. 1, showing the deflection of the piezo-strip and the resulting actuation of an indicator.

As shown in FIG. 2, when piezo-strip 18 is deflected causing strain within the material forming a portion of piezo-strip 18, the piezoelectric effect results in the generation of a voltage, which is at least the primary if not the sole voltage source for indicator 16. Piezo-strip 18 is attached to substrate 12 such that it can be deflected to produce strain-induced voltage therein. Thus, in the embodiment shown, piezo-strip 18 may be separated from the balance of substrate 12 along a cut line 22, and remain attached to substrate 12 along a common pivot edge 24. When displaced sufficiently, or a sufficient number of times, piezo-strip 18 provides a voltage to temporarily activate indicator 16, such as displaying an image at indicator 16. Indicator 16 may contain a message, such as advertising, a picture, etc. or produce a sound or other "interactive" (i.e., based on the deflection of piezo-strip 18) effect. The result of this interactive effect is that a user is inclined to spend more time looking at card 10, may keep card 10 as opposed to simply throwing it away, may share card 10 with friends or colleagues, etc.

Figure 3:
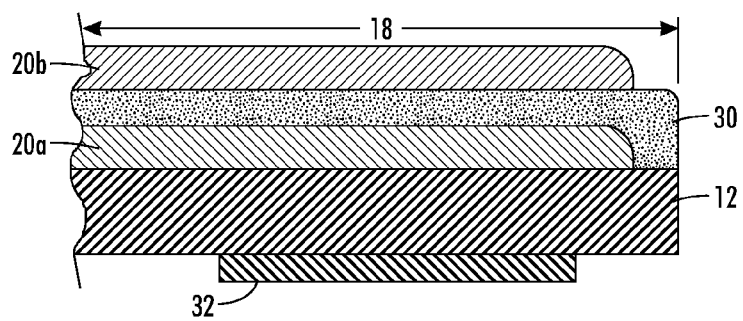
FIG. 3 is a cut-away cross-section of a portion of a piezo-strip according to an embodiment of the present disclosure.

FIG. 3 is a cut-away side view of a portion of card 10 and piezo-strip 18. Initially, interconnection 20a is formed over substrate 12. As used herein, a piezo-strip is a body of piezoelectric material with a size (length, width, thickness) and shape appropriate for inclusion or and/or attachment to a card-like substrate. A piezo-strip may be a discrete, preformed structure attached to a substrate or applied over a region of a substrate, with or without preformed electrical contacts. Alternatively, a piezo-strip may be a region of piezoelectric material, formed by printed electronics processes or otherwise, directly on a region of a substrate. When the piezoelectric material is applied to or formed over a portion of the substrate, that portion of the substrate is referred to as a piezo-strip region of the substrate.

In one embodiment, in the region of piezo-strip 18, a piezoelectric material 30 is deposited so that a portion of interconnection 20a is disposed under and in electrical communication with a lower surface of piezoelectric material 30. Piezoelectric material 30 may comprise a printed piezo-polymer such as piezoelectric polyvinylidene fluoride (PVDF), a PVDF copolymer such as PVDF-TrFE (trifluoroethylene), a printed piezo-composite, electret foam, etc. Examples of piezo-composites are silicon carbide/PVDF particulate composites, lead zirconate titanate (PZT)/polyimide particulate or fiber composites. In general, other composites combining piezoelectric particles with a piezoelectric or non-piezoelectric polymer are possible as well as piezoelectric polymers combined with non-piezoelectric particles. In one embodiment, piezoelectric material is deposited by printed electronics processes, but in other embodiments may be deposited by means other than printing, such as lamination. Alternatively, piezo-strip 18 may be formed of a ceramic piezo film which may be transfer printed onto the substrate. Thereafter, interconnection 20b is deposited such that a portion thereof overlaps the upper surface of piezoelectric material 30 and is in electrical communication therewith.

Optionally, a proof mass (e.g., small weight) 32 may be attached to piezo-strip 18, for example at a surface opposite that on which interconnections 20a, 20b, and piezoelectric material 30 are disposed, to increase the deflection force when shaking card 10 to effect deflection of piezo-strip 18.

According to a variation of the embodiment described above, the piezo-strip may be formed separate from the substrate, then the two subsequently attached together. Adhesive, mechanical fasteners (e.g., staples), tabs, or other securing mechanism may be used to join the piezo-strip to the substrate according to this variation. Moreover, ideally, the piezomaterial layer 30 is arranged so that the neutral plane upon bending is positioned outside the layer 30. This can be achieved for example by choosing a substrate 12 that is substantially stiffer and thicker than layers 20a, 20b, and 30.

Figure 4:
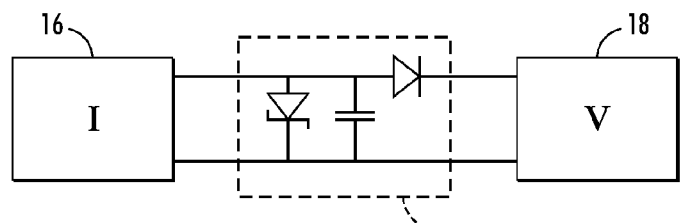
FIG. 4 is a schematic illustration of a circuit of a type which may be employed in the display-capable business card with piezo-strip shown in FIG. 1, according to an embodiment of the present disclosure.

The embodiments shown in FIGS. 1 and 2 illustrate that piezo-strip 18 may be connected directly to indicator 16 such that the voltage provided by the former may temporarily activate the latter. If needed, additional circuitry may be disposed between indicator 16 and piezo-strip 18, such as a capacitive charge storing circuit 40 shown in FIG. 4. A rectifying diode may be patterned in series with the piezo-film in order to limit the polarity of the supply voltage to a display. A capacitor may be added to store charge and a zener diode may be used to limit the amplitude of the supply voltage. Other circuits may be employed, including resistors, or thin-film transistors to limit or control the current or voltage to the displays. In one embodiment, circuit 40 is formed on substrate 12 (e.g., FIG. 1) by printed electronics processes together with indicator 16 and/or piezo-strip 18.

In the case in which indicator 16 is a visual display device, it may be patterned into a desired shape, display electrodes may be shaped to display a certain image, a template may be placed over the display surface etc., such that a desired image is presented upon deflection of piezo-strip 18. As a further alternative, indicator 16 may comprise an area that changes color when a voltage is applied by way of deflection of piezo-strip 18.

Figure 5:
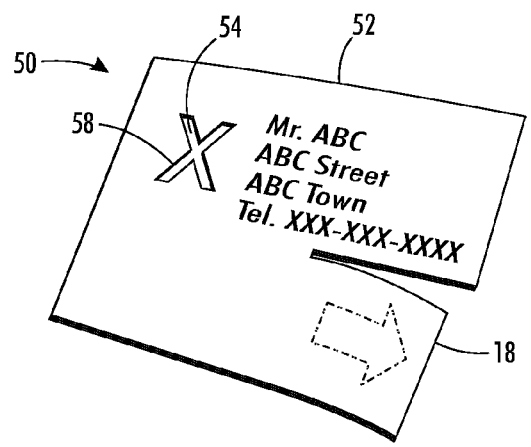
FIG. 5 is a photograph of a display-capable business card with piezo-strip and template over an indicator according to another embodiment of the present disclosure.
Figure 6:
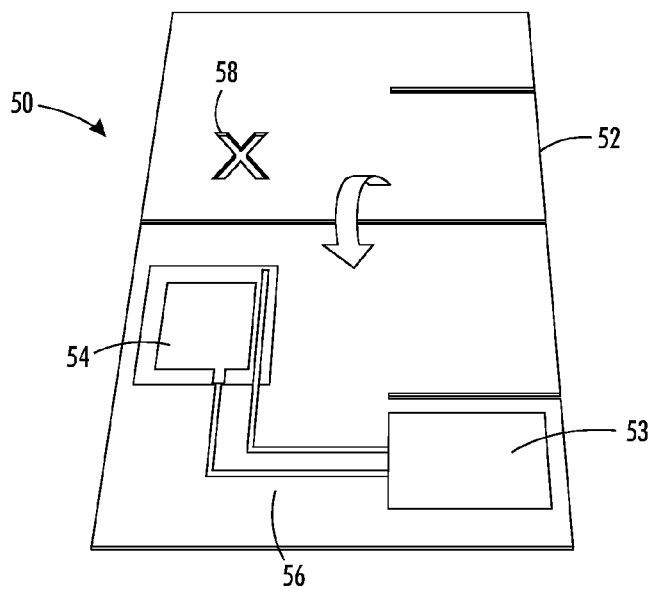
FIG. 6 is a photograph of the components of the display-capable business card with piezo-strip and template over an indicator shown in FIG. 5.

In the embodiment of FIGS. 1 and 2, an electrophoretic display changes between a white and a black state depending on the voltage, and the image can be seen through a template secured over the display. This can be further illustrated with reference to the embodiment 50 illustrated in FIG. 5, in which a template 52 is shown in place over the surface of an electrophoretic display 54, and removed to expose the circuitry 56 and template 52, in FIG. 6. (the "X" shape 58 forming an opening in template 52). In the black state (not shown), the "X" is generally not visible, and in the white state shown in FIG. 5 it is clearly visible. The circuitry in FIG. 6 consists of inkjet-printed silver traces that connect a PVDF piezopolymer sheet 53 with and electrophoretic display 54. The bottom electrode for the electrophoretic display and for the piezopolymer are also inkjet printed. The PVDF sheet 53 and the electrophoretic display 54 are laminated. With this concept, a message or image can be made visible or it can be concealed. It will now be appreciated that, if the card is mounted to a vibrating structure such as a car, bicycle wheel, running shoe, backpack, shopping bag, etc., an image may be displayed, or even to "flicker", (or alternatively a sound or other indication modulated) and thereby attract attention. It may also simply indicate the presence of a certain amount of vibration, acceleration, sound or air flow.

Figure 7:
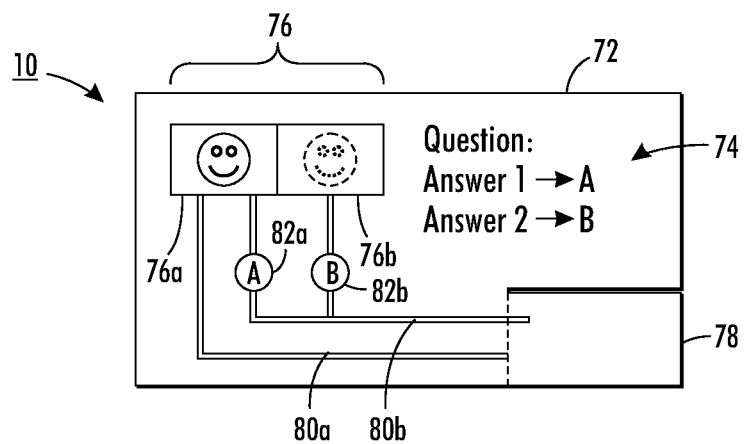
FIG. 7 is an illustration of a two-element display and selector card with piezo-strip according to an embodiment of the present disclosure.

While a single-display device is described above, devices providing two or more displays (or states) may be realized for example by card 70 illustrated in FIG. 7. As previously described, card 70 comprises a substrate 72, optionally having printed indicia 74 formed thereon. In the embodiment of card 70, a two-part indicator 76, comprising regions 76a and 76b, is formed on substrate 72. A piezo-strip 78 is formed as discussed above. Electrical interconnections 80a, 80b are also formed on substrate 72 electrically connecting indicator 76 and piezo-strip 78, such as by printed electronics processes.

Electrical interconnection 80b is connected to both indicator regions 76a, 76b via switches 82a, 82b, respectively. Switches 82a, 82b may be temporary-connection (non-latching) switches such that when a user holds one or the other down a temporary connection is made between indicator 76 and piezo-strip 78 via that switch. When pressing switch 82a and then actuating piezo-strip 78, region 76a of indicator 76 will show an image. Likewise, when switch 82b is pressed and piezo-strip 78 is actuated, region 76b of indicator 76 will show an image, but in this case different from the image shown when switch 82a is pressed. Such a concept may be part of a playing card, a selection, a test card, etc. In the embodiment in which switches 82a, 82b are non-latching, card 70 may be reused many times and a switch must be pressed while the piezo strip is actuated.

Various discussions of printed switches, as well as actual sample switched useful in these embodiments can be found, for example, at www.vdma.org/wps/portal/Home/en/Branchen/O/OEA/?WCM_GLOBAL_CONTEXT=/vdma/Home/en/Branchen/O/OEA/. A latching switch may be fabricated using an adhesive or tacky material between contacts in order to establish a more permanent connection. In the embodiment in which switches 82a, 82b are latching, card 70 may be used to more permanently record a response, such as student's answer to a test question. Other methods of temporarily or permanently selecting between displays may also be used, for example a punched hole may disconnect printed lines. Similar selection cards have been discussed which include thin-film batteries (see, e.g., www.novaled.com/downloadcenter/OE-A_Brochure2009_lowres.pdf). In each case, however, the circuit may be formed by printed electronics processes, together with the piezo-strip interactive power supply.

Figure 8:
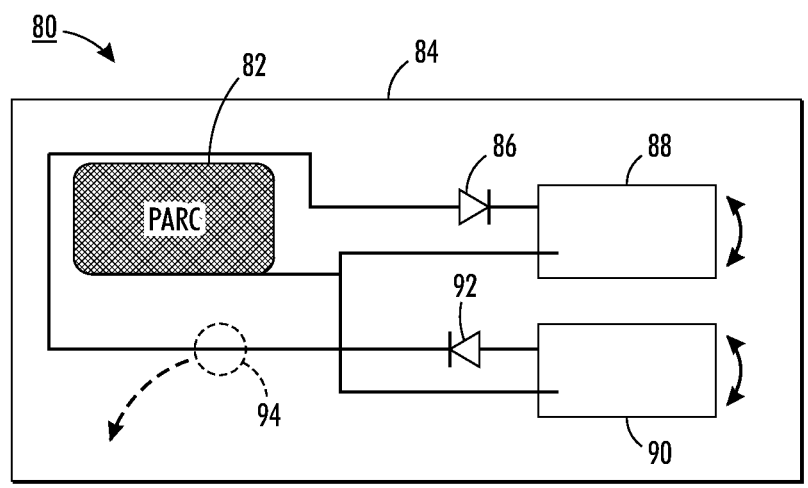
FIG. 8 is an illustration of a display-capable card with dual piezo-strips according to an embodiment of the present disclosure.

According to yet another embodiment shown in FIG. 8, card 80 comprises an indicator 82 (for example a visual display, acoustic or mechanical actuator, etc.) formed on a substrate 84. Indicator 82 is connected to a first diode 86 that rectifies the voltage provided by an actuated piezo-strip 88. When a downward force is applied to piezo-strip 88, it will switch the display to an indication (e.g., "white") state, whereas an upward force on piezo-strip 88 will have no effect on the display since first rectifying diode 86 will filter out this voltage.

A second piezo-strip 90, which bypasses first rectifying diode 86, is formed on substrate 84. Second piezo-strip 90 functions as a reset for indicator 82. Piezo-strip 90 may be disposed to switch the display element to both "white" (e.g., indication) and "black" (e.g., clear) states if it is directly connected to indicator 82 (i.e., not by way of a rectifying diode). Thus, piezo-strip 90 is useful as a "reset" switch to change the display back to the "black" state. However, according to one embodiment, the function of piezo-strip 90 is limited to a reset function. In this case, piezo-strip 90 may be connected to indicator 82 via second rectifying diode 92 so that actuation of piezo-strip 90, to initiate a reset, is limited to a single change of display state (e.g., to the clear state).

First and second rectifying diodes 86, 92 may be transistor diodes or vertical diodes. They may be formed by printed electronics processes together with other elements of card 80.

An optional switch 94 may be provided between indicator 82 and piezo-strip 90 in order to enable/disable the reset function of piezo-strip 90. For example, switch 94 may consist of an electrically conductive sticker that can be removed after resetting the display (e.g., for single-use reset), or that can be removed before use of card 80 (e.g., to preclude resetting the indicator). Switch 94 may alternatively comprise a region in which the conductor can be scratched off, again after one or more uses, or before use. Switch region 94 may also simply be punched out before use by means of a hole punch or a similar device.

While the piezo-strips described above and shown in the figures have so far been a relatively small portion of the substrate on which they are formed or to which they are secured, in certain embodiments they may comprise a majority of the substrate. For example, a card may be attached to an envelope. If the envelope is bent during transport, the label will indicate this event. The fact that the piezo-strip forms a majority of the substrate, and that the substrate is on the order of the size of the envelope, means the piezo-strip will be able to sense bending at virtually any spot on the envelope.

Furthermore, while the embodiments described thus far have shown the piezo-strip as a rectangular, deflectable region, in other embodiments the piezo-strip may be in the form of a depressible button. In use, the card with a button-shaped piezo-strip may be configured such that depressing the button (one or more times) results in actuation of a connected indicator, as previously described. Thus, many actual shapes and configurations of the piezo-strip are contemplated and disclosed herein.

In another embodiment, a card of a type disclosed herein may function as a motion sensor. If a proof mass is optionally attached to a piezo-strip, motion exceeding a desired threshold (such as a drop) will deflect that piezo-strip and actuate the display. The flexibility of the piezo-strip, the proof mass, the display characteristics, the piezoelectric material employed etc. all may be tailored to provide a desired sensitivity of such a motion sensor. Furthermore, a card of the type disclosed herein may also serve as a vibration sensor in which a vibration force on a piezo-strip slowly charges up the indicator (e.g., an electrophoretic display), a storage circuit connected to the indicator, etc. Other forces such as air or fluid pressure may also cause an actuation of a piezo-strip in a card of a type disclosed herein.

Figure 9:
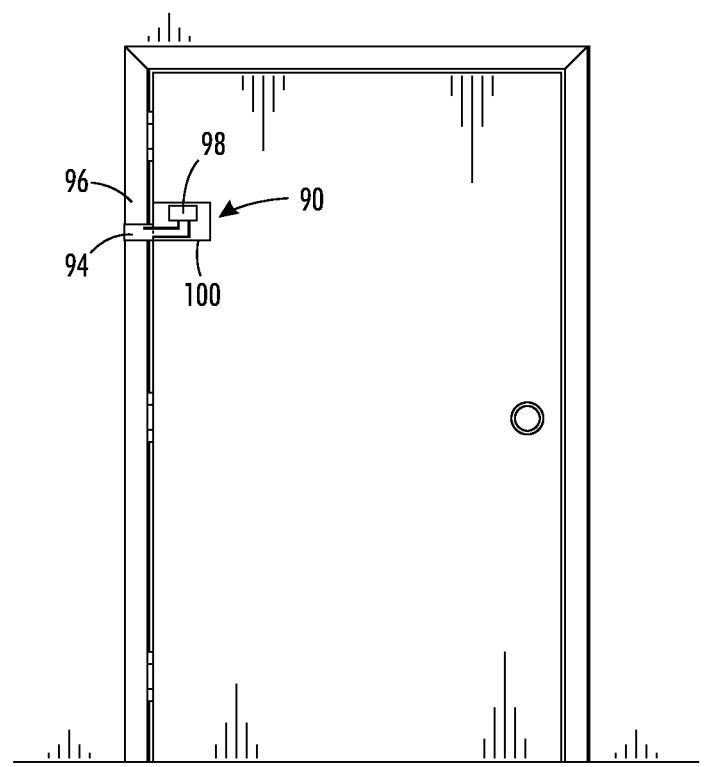
FIG. 9 is an illustration of an application of a display-capable card with piezo-strip as a sensor for indicating whether a door has been opened or closed, according to an embodiment of the present disclosure.
Figure 10:
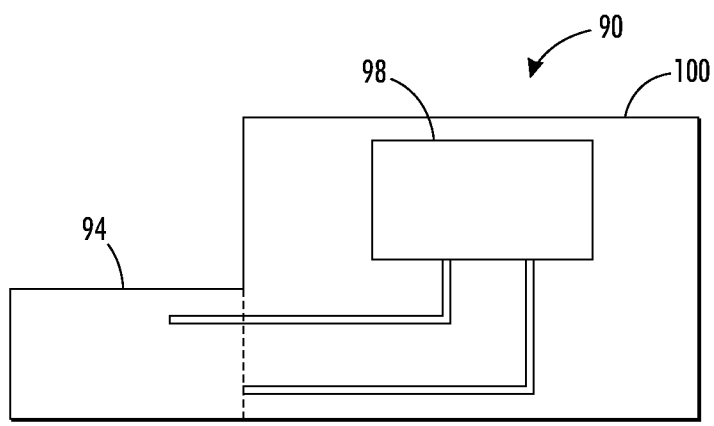
FIG. 10 is an illustration of a display-capable card in which a piezo-strip is electrically connected to a display element formed on a substrate such that the piezo-strip extends beyond the boundary of the substrate, according to an embodiment of the present disclosure.

Still further, a card of the type described herein may also be used to indicate whether a door, lid, etc., has been opened, closed, etc. For example, with reference to FIG. 9, a card 90 may be secured to a door 92. Card 90 has a piezo-strip 94 that may be secured to door frame 96 (or alternatively wall, door jamb, trim, hinge, etc.). Piezo-strip 94 may be deflected when opening or closing door 92, and so may actuate an indicator 98, for example to display a message. In such embodiments, and others described herein, the piezo strip may extend beyond the peripheral dimensions of the display carrying portion of substrate 100, as illustrate in FIG. 10.

Figure 11:
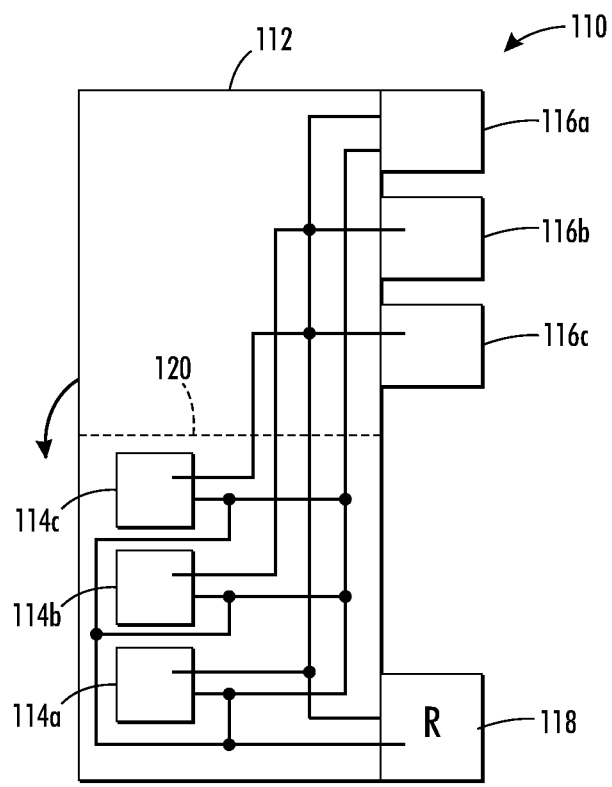
FIG. 11 is an illustration of another application of a display-capable card with a plurality of piezo-strips and associated indicators for indicating a fluid level in a container, according to an embodiment of the present disclosure.
Figure 12:
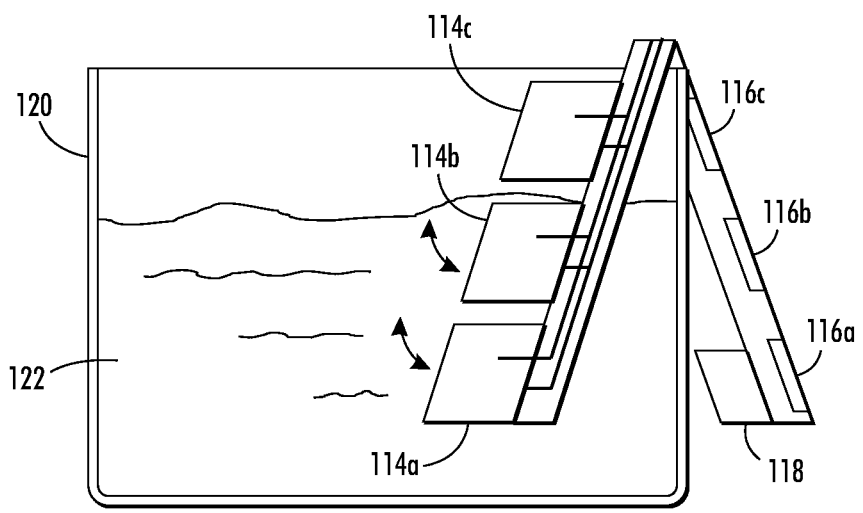
FIG. 12 is an illustration of fluid within a container and the display-capable card with a plurality of piezo-strips and associated indicators for indicating a fluid level of FIG. 11 disposed therein for indicating the level of the fluid within the container.

According to still another application of a piezo-charge device according to the present disclosure, several piezo-strips may be formed on or attached to a single substrate to form a level or flow sensor for, for example, fluids. With reference to FIG. 11, card 110 comprises a substrate 112 on which is formed a plurality of indicators 114a, 114b, 114c. A plurality of piezo-strips 116a, 116b, 116c. are formed on or attached to substrate 112 as previously described, and electrically interconnected to a respective indicator 114a, 114b, 114c. Each piezo-strip 116a, 116b, 116c. may be combined with a diode (not shown) to rectify the voltage, as previously described for example with reference to FIG. 8. Optionally, a reset piezo-strip 118 may be provided, as discussed above.

Card 110 can be folded over at line 118, and draped over the rim of a vessel 120 containing liquid 122. Piezo-strips 116a, 116b, 116c should therefore be formed of material or coated with material permitting them to be immersed in liquid. Any of a wide variety of waterproof or chemical proof coatings may be used provided they do not restrict the displacement of piezo-strips 116a, 116b, 116c. Optionally, the entirety of card 110 may be immersible in liquid. The present embodiment is advantageous for use with an opaque container, where viewing the liquid level is difficult. When agitated, liquid 122 causes displacement of piezo-strips 116a, 116b, which are immersed in the liquid. Piezo-strip 116c is not displaced (or at least displaced to a much lesser extent than piezo-strips 116a, 116b) due to the fact that it is not within liquid 122. The displacement of piezo-strips 116a, 116b results in a change of state (e.g., black to white) of indicators 114a, 114b, while indicator 114c does not change state (e.g., remains black). Thus, motion of liquid 122 will result in an indication of the level of the fluid within container 120.

It will now be appreciated that a variety of different embodiments and variations thereof have been disclosed which illustrate the scope of the present disclosure. However, several further general statements should be made. First, it should be understood that when a first layer is referred to as being "on" or "over" a second layer or substrate, it can be directly on the second layer or substrate, or on an intervening layer or layers may be between the first layer and second layer or substrate. Further, when a first layer is referred to as being "on" or "over" a second layer or substrate, the first layer may cover the entire second layer or substrate or a portion of the second layer or substrate. Still further, additional layers such as protective layers may be formed over the described layers.

No limitation in the description of the present disclosure or the claims following can or should be read as exclusive or absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. For example while each of the embodiments discussed above has contemplated a piezo-strip which is partly separated from the substrate, it is within the scope of the present disclosure to provide a piezoelectric material over a fully-attached portion of the substrate, which may be displaced and generate the desired voltage.

Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below. And the present disclosure may find use in any of a wide variety of applications such as, but not limited to, business cards, greeting cards and novelty items, toys and games, advertising and promotions, testing and education, sensors, etc.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. An interactive card with indicator, comprising:
   a substrate;
   a printed electronics indicator formed on said substrate;
   a first printed electronics displaceable region of piezoelectric material associated with said substrate, said first printed electronics displaceable region of piezoelectric material formed over a piezo-strip region of said substrate that is partially physically disconnected from the substrate in order to permit displacement of said piezo-strip region independently from the remainder of said substrate;
   electrical interconnections on said substrate connecting said indicator and said first region of piezoelectric material such that displacement of said first region of piezoelectric material generates a voltage therein that is provided to said indicator in order to actuate said indicator and thereby indicate the displacement of said first region of piezoelectric material.

2. The interactive card of claim 1, further comprising a proof mass attached to said piezo-strip region.

3. The interactive card of claim 1, wherein said substrate has printed indicia provided thereon.

4. The interactive card of claim 1, wherein said indicator is connected only to said first region of piezoelectric material as a voltage source such that voltage generated by said first region of piezoelectric material is the sole power source for said display.

5. The interactive card of claim 1, wherein said indicator is an electrophoretic display.

6. The interactive card of claim 1, wherein said indicator is selected from the group consisting of: liquid crystal, electrochromic, electrowetting, light emitting, interference, electrochemical, audible, thermal, haptic, and radio-communicative indicators.

7. The interactive card of claim 1, wherein said indicator is configured to display a selected image in response to displacement of said first region of piezoelectric material.

8. The interactive card of claim 1, further comprising a template placed over said indicator such that, upon actuation of said indicator, said indicator is visible through said template.

9. The interactive card of claim 1, further comprising charge storage circuitry formed on said substrate by printed electronics processes, said charge storage circuitry in electrical communication with said indicator and said first region of piezoelectric material, said charge storage circuitry for storing charge from said first region of piezoelectric material for actuating said indicator.

10. The interactive card of claim 1, further comprising rectifying circuitry formed on said substrate by printed electronics processes in electrical communication with said indicator and said first region of piezoelectric material, said rectifying circuitry limiting the polarity of the voltage supplied by said first region of piezoelectric material to said indicator.

11. The interactive card of claim 1, wherein said indicator comprises a first region and a second region, and further comprising switching circuitry formed on said substrate by printed electronics processes in electrical communication with said indicator and said first region of piezoelectric material, said switching circuitry limiting the voltage supplied by said first region of piezoelectric material to either said first indicator or said second indicator.

12. The interactive card of claim 1, further comprising a second printed electronics displaceable region of piezoelectric material associated with said substrate and electrically connected to said indicator by said electrical interconnections.

13. The interactive card of claim 12, further comprising rectifying circuitry formed on said substrate by printed electronics processes, said rectifying circuitry in electrical communication with said indicator, said first region of piezoelectric material, and said second region of piezoelectric material, said rectifying circuitry limiting the polarity of the voltage supplied by said first region of piezoelectric material to said indicator such that said indicator may be changed by a voltage provided by said first region of piezoelectric material only from a first state to a second state, and further said rectifying circuitry limiting the polarity of the voltage supplied by said second region of piezoelectric material to said indicator such that said indicator may be changed by a voltage provided by said second region of piezoelectric material only from a second state to a first state.

14. The interactive card of claim 13, further comprising disable switching circuitry for either temporarily or permanently disabling the second region of piezoelectric material such that said indicator may not thereby be changed from said second state to said first state.

15. An interactive card with a plurality of indicators, comprising:
   a substrate;
   a plurality of printed electronics indicators formed on said substrate;
   a plurality of printed electronics displaceable regions formed on said substrate, each said region comprising piezoelectric material, each said printed electronics displaceable region formed over a corresponding piezo-strip region of said substrate that is partially physically disconnected from the substrate in order to permit displacement of said piezo-strip region independently from a remainder of said substrate a remainder of said piezo-strip regions;
   electrical interconnections on said substrate connecting each said indicator and a unique one of said printed electronics displaceable regions;
   whereby displacement of one or more of said printed electronics displaceable regions generates a voltage therein that is provided to said indicator to which that printed electronics displaceable region is uniquely connected by said electrical interconnections in order to actuate said indicator and thereby indicate the displacement of said printed electronics displaceable region.

16. The interactive card of claim 15, wherein said electrical interconnections, said plurality of printed electronic indicators, and said plurality of printed electronics displaceable regions are formed and located such that said substrate is foldable proximate a fold line without damaging said electrical interconnections, said plurality of printed electronic indicators or said plurality of printed electronics displaceable regions.

17. The interactive card of claim 16, wherein said card has a long axis, a distal end, a proximal end, with said fold line therebetween, wherein:
- said plurality of printed electronic indicators are arranged along said long axis between said distal end and said centerline;
- said plurality of printed electronics displaceable regions are arranged along said long axis between said proximal end and said centerline; and
- a first of said plurality of printed electronic indicators located closest to said distal end is in electrical communication with a first of said plurality of printed electronics displaceable regions located closest to said proximal end, a second of said plurality of printed electronic indicators located adjacent said first of said plurality of printed electronic indicators is electrically connected to a second of said plurality of printed electronic displaceable regions located adjacent said first of said plurality of printed electronic displaceable regions, additional ones of said plurality of printed electronic indicators electrically are connected to correspondingly positioned additional ones of said plurality of printed electronic displaceable regions, and a last of said plurality of printed electronic indicators located closest to said fold line is in electrical communication with a last of said plurality of printed electronics displaceable regions located closest to said fold line.

18. The interactive card of claim 16, wherein said printed electronics displaceable regions are formed so as to be immersible in liquid.

\* \* \* \* \*